United States Patent [19]
Nguyen et al.

[11] Patent Number: 5,766,695
[45] Date of Patent: Jun. 16, 1998

[54] METHOD FOR REDUCING SURFACE LAYER DEFECTS IN SEMICONDUCTOR MATERIALS HAVING A VOLATILE SPECIES

[75] Inventors: Chanh N. Nguyen, Newbury Park; Robert G. Wilson, Winnetka, both of Calif.

[73] Assignee: Hughes Electronics Corporation, El Segundo, Calif.

[21] Appl. No.: 756,421

[22] Filed: Nov. 26, 1996

[51] Int. Cl.$^6$ ............... B05D 3/06; H01L 21/265
[52] U.S. Cl. ............... 427/553; 427/523; 427/526; 438/919; 438/918; 438/541; 438/517; 148/DIG. 40
[58] Field of Search .................. 427/553, 523, 427/526; 438/919, 918, 514, 517; 148/DIG. 40

[56] References Cited

U.S. PATENT DOCUMENTS

| | | | |
|---|---|---|---|
| 4,060,427 | 11/1977 | Barile et al. | 148/1.5 |
| 4,818,721 | 4/1989 | Wang | 437/22 |
| 5,403,756 | 4/1995 | Yoshinouchi et al. | 438/517 |

OTHER PUBLICATIONS

Pearton et al., "Process development for III-V nitrides". *Materials Science and Engineering B38*, 1996, pp. 138-146.
S.M. Sze, *VSLI Technology*, McGraw-Hill, 1988, pp. 127 and 355-362.
R.G. Wilson, "Implantation Range Statistics in III-V Materials", *Journal of the Electgro-chemical Society*, vol. 138, No. 3, Mar. 1991, pp. 718-722.

*Primary Examiner*—Roy V. King
*Attorney, Agent, or Firm*—V. D. Duraiswamy; W. K. Denson-Low

[57] ABSTRACT

The number of surface defects in semiconductor materials having a volatile species, particulary group-III nitride-based semiconductor devices, are reduced by first implanting species atoms into the semiconductor sample to fill some of the surface layer species vacancies created by growth and device fabrication processes, and then rapid thermal annealing the sample to repair broken bonds and crystalline defects and to move implanted species atoms from interstitial to substitutional sites. An optional third step deposits a dummy layer on the sample surface prior to implantation, making possible an implantation profile that places a higher density of species atoms in the surface layer than is attainable without the dummy layer and to inhibit species atoms from leaving the sample during high-temperature processing steps that follow.

25 Claims, 3 Drawing Sheets

METHOD FOR REDUCING SURFACE LAYER DEFECTS IN SEMICONDUCTOR MATERIALS HAVING A VOLATILE SPECIES

BACKGROUND OF THE INVENTION

1. Field of the Invention

This invention relates to the field of semiconductor fabrication, and particularly to methods of reducing defects in the surface layer of group-III nitride-based semiconductors.

2. Description of the Related Art

Group-III nitride materials such as GaN, AlN and InN have attracted much attention as semiconductor materials due to their intrinsic properties, including large direct bandgaps, high breakdown fields and high peak and saturated electron velocities. In particular, these alloys have emerged as very promising materials for short-wavelength light emitters and high-power/high-temperature electronic devices.

In practice, however, group-III nitride-based compounds have been difficult to process as well as to grow. Surface defects occurring under certain growth conditions or caused by device fabrication processes are a major problem in making high-performance devices. High growth temperatures required for optimal bulk properties cause a loss of nitrogen in the epitaxial films during growth interruption and/or cool-down cycles—because nitrogen is a volatile gas with a high vapor pressure, nitrogen atoms often escape when the bonds with group-III atoms are broken. This results in a "sample", i.e., a semiconductor wafer or portion of a wafer being processed, with a surface layer that contains a high concentration of nitrogen vacancies ("N-vacancies"). The "surface layer" is a region of a sample that has electrical properties different from those found in the rest of the sample due to its exposure to fabrication processes such as etching, annealing, polishing, sputtering and thermal treatments in general. For example, the local electron concentration in the surface layer may be much higher (or much smaller) than that found 1 micrometer below the surface. The surface layer is typically the top 0.05 to 0.1 micrometers of a sample.

Additional surface defects are caused by the pattern etching method that must be used with group-III nitrides. Because of the chemical stability of GaN, AlN and their ternary alloys, it is extremely difficult to etch these materials using wet chemical etching. To date, there is no known wet etchant that can define patterns with the geometry and dimensions required for group-III nitride devices. In order to pattern these compounds, reactive ion etching (RIE) or chemical plasma etching techniques must be used. Unfortunately, RIE involves the bombardment of the surface layer by ions with kinetic energies many times the bond strength, causing bonds to be broken and additional N-vacancies to form. Other high temperature processing steps, including annealing, metallization deposition and alloying, can also cause N-vacancies to form in the surface layer.

These surface defects, particularly the nitrogen vacancy-related defects that are specific to group-III nitride compounds, are responsible for high surface recombination velocities, large leakage currents and low breakdown voltages in devices fabricated with these materials. In p-type GaN, ohmic contact resistivity is usually high because acceptors in the surface layer are compensated by surface defects. FETs made from GaN reportedly have rather high gate leakage currents, and breakdown voltages that are lower than expected based on the intrinsic breakdown field of GaN.

Several methods have been tried to remove the surface defects. A conventional approach taken to reduce process-induced surface damage is thermal annealing. However, due to the high volatility of nitrogen, thermal annealing actually increases the concentration of nitrogen-vacancy defects, thus causing the treatment to be ineffective. A variation of thermal annealing is to cap the "sample", i.e., the semiconductor wafer or portion of a wafer that is being processed, with a silicon nitride or silicon oxinitride layer before subjecting it to the high temperatures of thermal annealing. The purpose of the cap is to prevent the additional loss of nitrogen during the anneal. However, nitrogen vacancies already present in the surface layer are not reduced by this method.

Mechanical lapping and chemical polishing have also been proposed to repair a damaged surface layer. However, mechanical lapping is very likely to cause additional surface damage. Also, lapping can only be performed on a flat surface. As noted above, some of the surface defects are caused by the RIE patterning process necessitated by group-III nitride based materials. The surface of a sample is no longer flat after being patterned, which renders mechanical lapping unusable. Chemical polishing, though useful to treat the entire surface area of a full wafer, is essentially impossible to use on a device-patterned wafer. Processing difficulties associated with group-III nitrides are discussed in "Process development for III–V nitrides" by S. J. Pearton et al., *Materials Science and Engineering B38* (1996) pp. 138–146.

Another approach has been to anneal the sample in the presence of ambient nitrogen pressurized to about 5 atmospheres, which inhibits nitrogen from leaving the surface layer and can fill some existing N-vacancies. However, the technique is similar to diffusion, and as such its effectiveness is limited to N-vacancies found within about 200 angstroms of the surface, while vacancies that can cause poor performance may be as deep as 1 micron below the surface. Also, since high-temperature processes for semiconductors are not commonly carried out at a high pressure, this technique requires specialized, expensive equipment.

Similar problems arise in other semiconductor compounds in which one or more of the species making up the compound is highly volatile. A large number of "species vacancies" occur during the processing of zinc sulfide, for example, due to sulfur's high volatility. "Species vacancies" and "nitrogen vacancies" as used herein refer to locations in a compound's lattice structure in which atoms of the volatile species ("species atoms") are needed for optimum device performance, but are absent.

A need exists for a simple, effective method of reducing surface defects, particularly species vacancies in the surface layer of compounds used to fabricate semiconductor devices.

SUMMARY OF THE INVENTION

A method is presented for reducing the number of surface defects caused by the growth and device fabrication processes used to produce group-III nitride-based semiconductor devices as well as other devices formed from compounds having a volatile species.

The method includes two required steps and an optional third step. First, atoms of the volatile species are implanted into the semiconductor sample to fill some of the species vacancies created by the growth and device fabrication processes. When performed as described herein, the majority of the implanted atoms occupy interstitial sites in the surface layer. Second, the sample is subjected to a thermal anneal. This step serves two functions: broken bonds and crystalline defects are annealed, and interstitial species atoms are moved to substitutional sites where they will be electrically active.

An optional third step is preferably performed that improves the effectiveness of the present method. A dummy layer such as silicon nitride is deposited on the sample surface prior to the implantation of species atoms. The dummy layer provides two advantages. First, the dummy layer absorbs some of the implantation energy, making possible an implantation profile that implants a higher density of species atoms closer to the surface than is attainable without the dummy layer. Second, the dummy layer acts as a cap to prevent volatile species atoms from leaving the sample during both the implantation and annealing steps that follow.

The surface layer of a compound treated in this way has a reduced number of species vacancies. The method is particularly useful for reducing the number of nitrogen vacancies that occur during fabrication of the important class of semiconductor devices based on group-III nitrides. For example, a GaN p-type surface layer so treated will not be compensated, resulting in much better p-type ohmic contacts. Schottky barriers will have much smaller leakage currents, and the breakdown voltage of FETs will correspond more closely to the true breakdown field of a group-III nitride than what has previously been achievable.

Further features and advantages of the invention will be apparent to those skilled in the art from the following detailed description, taken together with the accompanying drawings.

DETAILED DESCRIPTION OF THE INVENTION

When a group-III nitride semiconductor material such as GaN is grown, nitrogen (N) atoms are typically lost during the process. During the cool-down cycle, N-atoms escaping from the surface layer of the sample produce N-vacancies specifically in the region of the sample in which devices are formed. Reactive ion etching (RIE) techniques used to pattern the sample create additional N-vacancies in the critical surface layer, as do subsequent high temperature processing steps. These N-vacancies create a number of performance-related problems and must be reduced if devices based on group-III nitrides are to operate near their theoretical capabilities. This specification primarily focuses on group-III nitride-based samples, but it is understood that similar surface defects arise during the processing of other samples formed from compounds with a volatile species, and that the method described is equally applicable to such samples.

The present method requires two basic steps to be performed to reduce N-vacancies. First, an ion implantation of nitrogen atoms is performed to fill some of the N-vacancies that exist in the surface layer. This is followed by an annealing step that repairs broken bonds and crystalline defects and moves implanted N-atoms from interstitial to substitutional sites.

Figure 1:
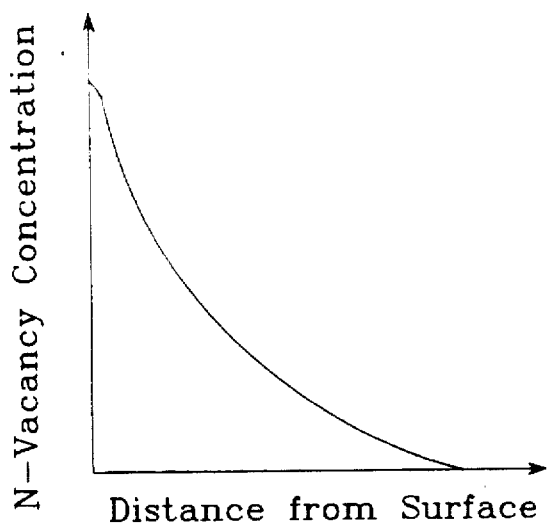
FIG. 1 is a normalized plot of a typical nitrogen-vacancy concentration profile for a group-III nitride-based semiconductor sample.

FIG. 1 is a plot of nitrogen vacancy concentration versus distance from the surface for a typical group-III nitride-based sample that has been grown and patterned. As can be seen, the highest concentration of defects is at the surface. An ion implantation of nitrogen atoms into the sample will fill some of the N-vacancies. Ideally, the implantation profile would peak at the surface of the sample.

Figure 2:
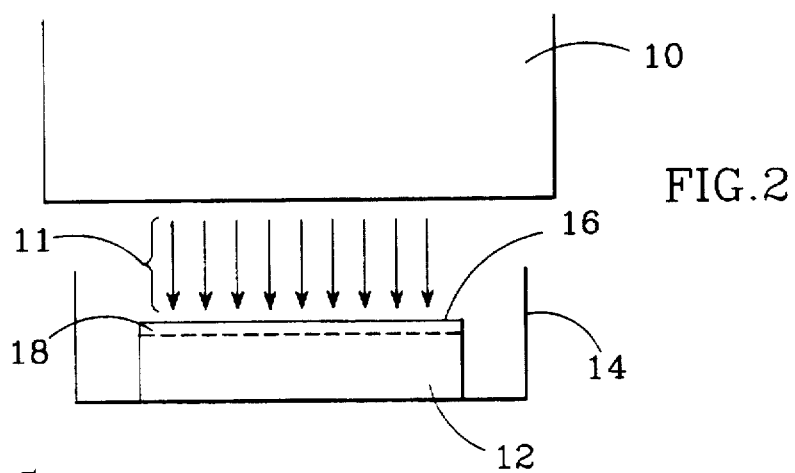
FIG. 2 is an elevation view of an ion implantation step per the present method.

An ion implanter 10 and a sample 12 to be treated are shown in FIG. 2. The sample is held in an implantation target holder 14. Nitrogen atoms 11 emitted by the implanter strike the surface 16 of the sample and enter the surface layer 18. Some of the implanted atoms come to rest within the surface layer 18. However, most of the atoms are carried through the surface layer by the implantation energy before coming to rest. The majority of implanted atoms occupy interstitial sites in the sample.

Figure 3:
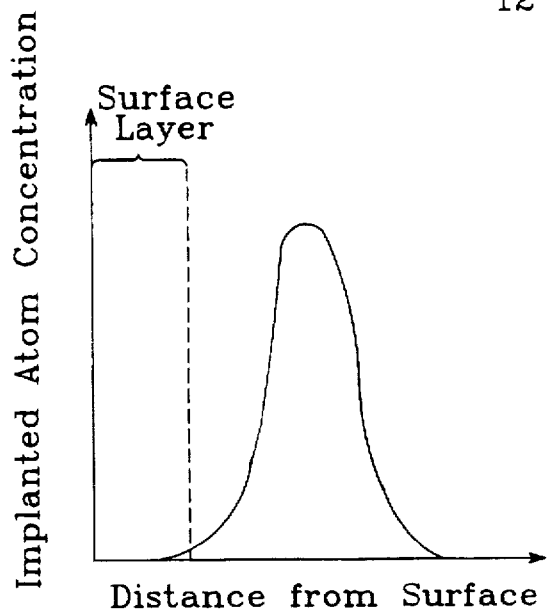
FIG. 3 is a normalized plot of a typical profile of implanted atoms following the ion implantation step of FIG. 2.

An implantation performed as described above typically results in a concentration profile such as that shown in FIG. 3, with the concentration of implanted N-atoms peaking some distance below the surface layer. Although this distance can be reduced by implanting at a lower energy, it is difficult to achieve a high concentration of implanted atoms at the surface of the sample. Still, some of the N-vacancies in the surface layer are filled by implanted atoms and the number of surface defects is reduced. An optional step that greatly improves the effectiveness of the implantation step is discussed below.

Following the implantation of nitrogen atoms, the sample is annealed. This step provides two functions: broken bonds and crystalline defects are reduced, and some of the nitrogen atoms occupying interstitial sites move to substitutional sites where they will be electrically active. The temperature and duration of the anneal needed to accomplish these functions are determined by techniques well-known in the art, and are discussed for example in S. M. Sze, *VSLI Technology*, McGraw-Hill (1988), pp. 355-362.

An optional step is preferably performed that improves the effectiveness of the ion implantation step and prevents nitrogen that might otherwise leave the sample during the anneal step from escaping. This involves the deposition of a dummy layer onto the surface layer prior to the implantation. The dummy layer absorbs some of the implantation energy. By varying the implantation energy and/or the thickness of the dummy layer, the implantation profile can be controlled and the concentration peak positioned to achieve a much greater reduction of N-vacancies in the surface layer than would otherwise be possible. An appropriate material for the dummy layer is one that is chemically compatible with both the compound being processed and the device manufacturing process. Silicon nitride ($SiN_x$) and silicon oxi-nitride ($SiN_yO_z$) are acceptable materials for the dummy layer when deposited over a group-III nitride. Values of x, y and z of between 0 and 1 are acceptable.

Figure 4:
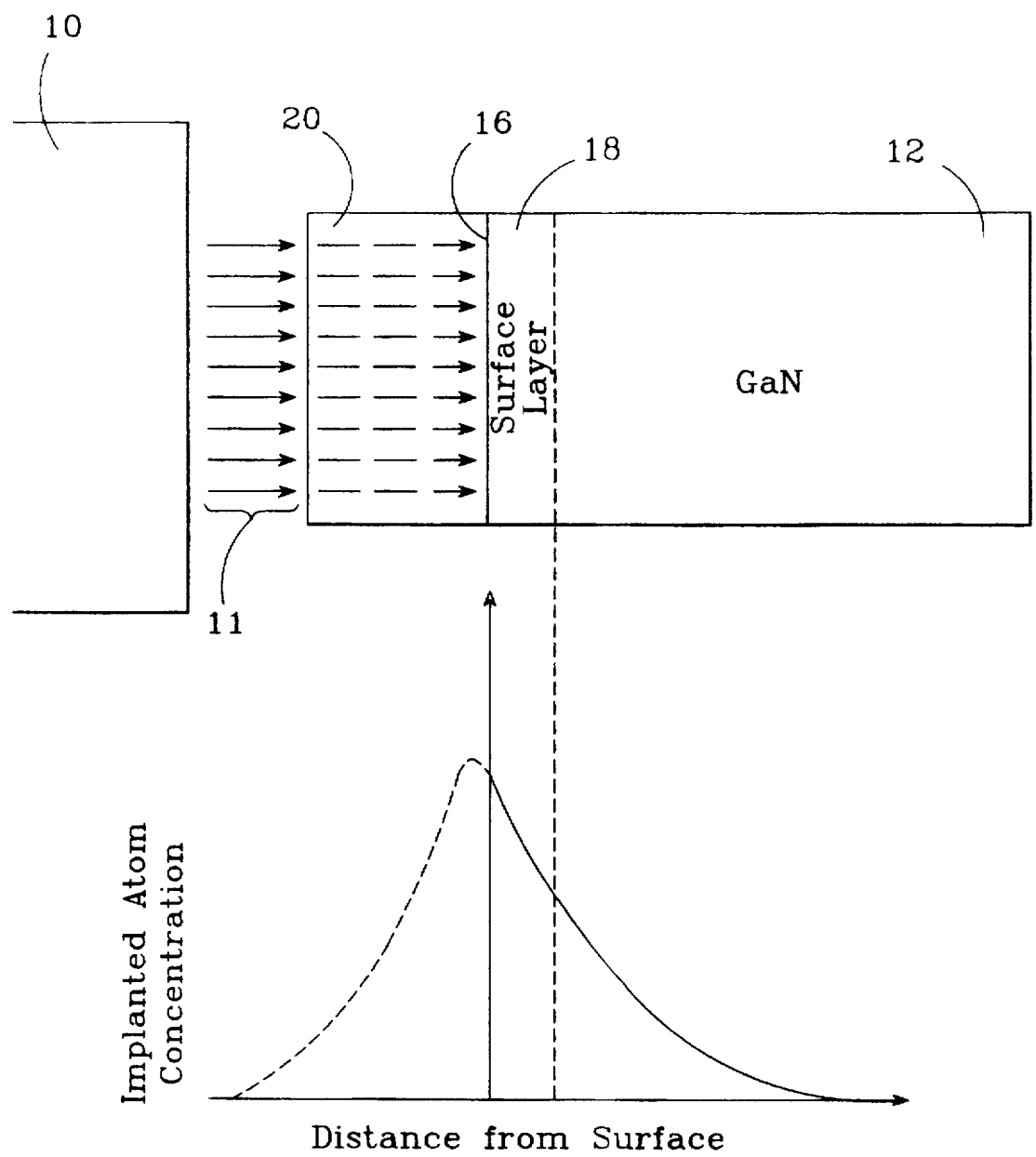
FIG. 4 is an elevation view of an ion implantation step incorporating a dummy layer per the present method and a corresponding plot of the resulting implantation profile.

Use of a dummy layer enables the creation of an implantation profile that nearly matches the N-vacancy concentration profile present in the sample's surface layer. FIG. 4 shows a sample 12 of GaN covered with a SiN$_x$ dummy layer 20; also shown is the implantation atom concentration plot that results when an ion implantation is performed through the dummy layer. The positioning of the implantation atom profile peak is controlled by selecting an appropriate implantation energy and dose and an appropriate thickness for the dummy layer. In FIG. 4, the implantation profile is positioned to peak within the dummy layer so that the portion of the profile that is within the sample closely matches the N-vacancy profile of FIG. 1.

In addition to substantially improving the controllability of an implantation profile, a dummy layer also prevents nitrogen from escaping from the surface layer during subsequent processing steps. The present method requires that an anneal follow the implantation. The dummy layer prevents N-atoms from leaving the surface layer during this and other high-temperature processing steps. The dummy layer can either be removed or used as an encapsulation and/or passivation layer.

Species, energy and dose parameters are selected to provide a desired implantation profile. The species to use with a group-III nitride-based sample is nitrogen. The implantation energy is chosen to position the concentration peak where needed to obtain a significant reduction of N-vacancies within the surface layer. The implantation dose is determined by matching the implantation fluence with the approximate nitrogen-vacancy concentration in the surface layer, which is determined as described below.

The process described herein can be beneficially performed at several points in the fabrication process, and may be performed on a given sample more than once. For example, the process might be performed to reduce N-vacancies created by the cool-down cycle and again to reduce N-vacancies caused by a thermal anneal. Each such processing step produces a unique N-vacancy concentration profile. Thus, the concentration profile created by each processing step which is to be followed with the present method should be determined separately and empirically. Capacitance-voltage techniques are one method of obtaining an N-vacancy concentration profile, and are discussed in S. M. Sze, *VSLI Technology*, McGraw-Hill (1988), p. 127. An N-vacancy concentration profile can be determined for each relevant processing step using a representative sample, and the profiles so obtained can be assumed to be valid for all similar samples. More generally, species-vacancy concentration profiles can similarly be determined for other compounds which have a volatile species.

With an approximate N-vacancy concentration profile determined, an ion implantation is performed. Methods of calculating the ion implantation energy and dose needed to implant a particular number of atoms to a particular depth are well-known and are discussed in "Implantation Range Statistics in III–V Materials" by R. G. Wilson, *Journal of the Electrochemical Society*, Vol. 138, No. 3, Mar. 1991, pp. 718–722. A dose of nitrogen atoms that is too low will leave a large number of nitrogen vacancies, leaving the problem uncorrected. Conversely, a dose that is too high can result in additional damage and nitrogen interstitials by causing excessive lattice disorder.

A dummy layer thickness of about 0.1 µm and an implantation energy value of about 50 keV will typically produce acceptable results. Note that increasing the thickness of the dummy layer requires a corresponding increase in implantation energy to obtain a given desired result. The relationship between dummy layer thickness and implantation energy are well-known in the art; appropriate value can be determined, for example, by using a calculation program known as "TRIM", available from IBM Corporation's Watson Research Lab.

Figure 5:
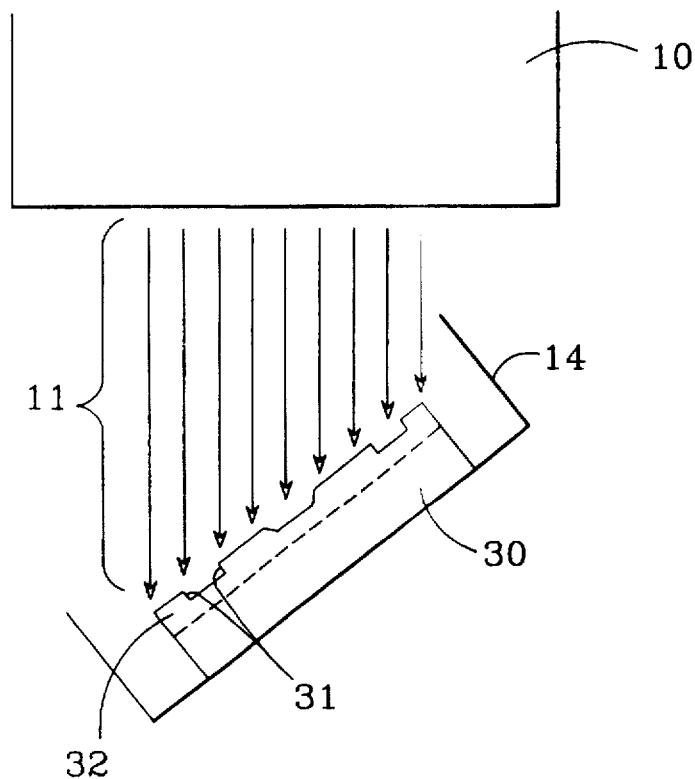
FIGS. 5 and 6 are elevation views of ion implantations performed on samples that have been tilted per the present method.
Figure 6:
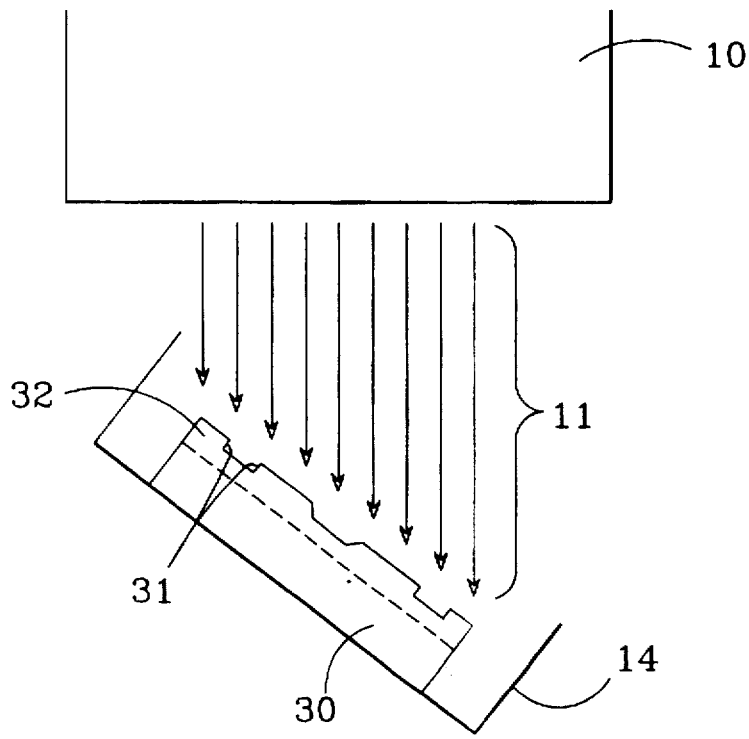

Side-walls having surfaces that are not in the plane of the surface layer and surfaces perpendicular to the surface layer may be treated by tilting the sample so that they can receive implanted atoms. This is preferably accomplished by angling the implantation target holder as shown in FIGS. 5 and 6, in which the implantation target holder 14 holds a sample 30 which has been patterned, resulting in side walls 31 in its surface layer 32. To achieve the desired reduction of surface defects on opposing side walls requires that implantations be performed at about +45 degrees (FIG. 5) and at about −45 degrees (FIG. 6) with respect to the normal of the surface layer.

If implantations are performed at +45 and −45 degrees as discussed above, there is no need to perform a "normal" implantation as shown in FIG. 2, since an angled implantation implants atoms throughout the surface layer. However, to provide the same depth of implantation as would be achieved with a normal implantation, the implantation energy must be greater than would be used for the "normal" implantation. Also note that if the sample is subjected to two "angled" implantations instead of one "normal" implantation, the dose parameter should be correspondingly reduced for each angled implantation.

The thermal anneal that follows the implantation is preferably a rapid thermal annealing (RTA). An RTA is preferred because it confines the deposition of thermal energy primarily to the near-surface region of the sample rather than the bulk region, where unwanted impurity diffusion could occur. The duration and temperature of the RTA are selected to move the implanted N-atoms from their interstitial sites to substitutional sites. An RTA performed at a temperature of about 1100 degrees C for a duration of 10 seconds is acceptable for a GaN sample. Rapid thermal annealing is described in S. M. Sze, *VSLI Technology*, McGraw-Hill (1988), pp. 359–362.

The use of an ion implantation that places an appropriate number of N-atoms in the surface layer, preferably with the aid of a dummy layer and in combination with a rapid thermal annealing step serves to passivate exposed sample surfaces and reduce process-induced surface layer damage that has an adverse affect on device performance. After this treatment, the surface layer of a group-III nitride-based semiconductor has a substantially reduced N-vacancy concentration. Those vacancies that would have otherwise formed in a normal thermal anneal will not occur due to the presence of a high concentration of implanted N-atoms. Therefore, a p-type surface layer so treated will not be compensated, and much better p-type ohmic contacts will result. Schottky barriers will have small leakage currents, and the breakdown voltage of FETs formed on treated samples also increases substantially from the poor values previously achievable to values corresponding to the true breakdown field of a group-III nitride.

The present method is applicable to both p- and n-type group-III nitride-based samples. The method can also be applied to other wide band-gap, high-temperature materials that include a volatile species, such as zinc sulfide (ZnS). The same steps are followed, except that S atoms are implanted instead of N-atoms. Implantation energy and dose parameters and RTA duration and temperature parameters would require adjustment as appropriate for a different compound.

While particular embodiments of the invention have been shown and described, numerous variations and alternate embodiments will occur to those skilled in the art. Accordingly, it is intended that the invention be limited only in terms of the appended claims.

We claim:

1. A method of reducing surface defects in the surface layer of a semiconductor sample which includes a volatile species, comprising the steps of:
   implanting atoms of said volatile species into the surface layer of said sample to fill species vacancies existing in said surface layer, and
   annealing said sample to move some of said implanted atoms from interstitial to substitutional sites in said surface layer, said annealing performed after said implanting,
   said implanting and annealing reducing the number of species vacancies in said surface layer,
   wherein said sample is formed from a Group-III nitride and said volatile species is nitrogen.

2. The method of claim 1, further comprising the step of covering said surface layer with a dummy layer prior to said implanting step to enable a higher percentage of atoms to be implanted in said surface layer and to inhibit additional losses of said volatile species atoms from said surface layer.

3. The method of claim 2, wherein said dummy layer comprises silicon nitride.

4. The method of claim 2 wherein said dummy layer comprises silicon oxi-nitride.

5. The method of claim 1, wherein said annealing step is a rapid thermal annealing.

6. The method of claim 1, wherein said implanting step is performed with an ion implanter.

7. A method of reducing surface defects in the surface layer of a semiconductor sample which includes a volatile species, comprising the steps of:
   implanting atoms of said volatile species into the surface layer of said sample to fill species vacancies existing in said surface layer, and
   annealing said sample to move some of said implanted atoms from interstitial to substitutional sites in said surface layer, said annealing performed after said implanting,
   said implanting and annealing reducing the number of species vacancies in said surface layer,
   wherein said sample is formed from zinc sulfide and said volatile species is sulfur.

8. A method for reducing surface defects in the surface layer of a semiconductor sample which includes a volatile species, comprising the steps of:
   covering the surface layer of the semiconductor sample which includes a volatile species with a dummy layer,
   implanting atoms of said volatile species into said sample through said dummy layer at an energy necessary to implant some of said atoms to fill species vacancies in said surface layer, and
   rapid thermal annealing said sample for a duration and time necessary to move some of said implanted species atoms which occupy interstitial sites in the surface layer to substitutional sites in the surface layer,
   so that said surface layer has less species vacancies after said covering, implanting and annealing than before, and
   wherein said volatile species is nitrogen, said species vacancies are nitrogen vacancies, and said species atoms are nitrogen atoms.

9. The method of claim 8, wherein said sample comprises gallium nitride (GaN).

10. The method of claim 8, wherein said dummy layer comprises silicon nitride.

11. The method of claim 8, wherein said dummy layer comprises silicon-oxi-nitride.

12. The method of claim 8, wherein the dose of atoms implanted is determined by matching the implantation fluence with an approximation of the species-vacancy concentration profile within said surface layer.

13. The method of claim 8, further comprising the step of removing said dummy layer after said annealing.

14. The method of claim 8, further comprising the step of tilting said sample prior to the implanting of species atoms so that a side wall on said surface layer receives implanted species atoms to fill species vacancies.

15. The method of claim 14, wherein said sample is titled at an angle of about +45 degrees with respect to the normal of said surface layer to implant species atoms on a first side wall, and further comprising the step of tilting said sample at an angle of about −45 degrees with respect to the normal of said surface layer to implant species atoms on an opposite side wall.

16. The method of claim 8, wherein said implanting step is performed with an ion implanter.

17. A method for reducing surface defects in the surface layer of a semiconductor sample which includes a volatile species, comprising the steps of:
   covering the surface layer of the semiconductor sample which includes a volatile species with a dummy layer,
   implanting atoms of said volatile species into said sample through said dummy layer at an energy necessary to implant some of said atoms to fill species vacancies in said surface layer, and
   rapid thermal annealing said sample for a duration and time necessary to move some of said implanted species atoms which occupy interstitial sites in the surface layer to substitutional sites in the surface layer,
   so that said surface layer has less species vacancies after said covering, implanting and annealing than before, and
   wherein said semiconductor sample which includes a volatile species is a group-III nitride-based semiconductor sample, said species vacancies are nitrogen vacancies, and said species atoms are nitrogen atoms.

18. The method of claim 17 wherein said sample comprises gallium nitride (GaN).

19. The method of claim 17 wherein said dummy layer comprises material selected from the group consisting of silicon nitride and silicon oxi-nitride.

20. The method of claim 17, wherein the dose of atoms implanted is determined by matching the implantation fluence with an approximation of the species-vacancy concentration profile within said surface layer.

21. The method of claim 17, further comprising the step of removing said dummy layer after said annealing.

22. The method of claim 17, wherein said implanting step is performed with an ion implanter.

23. A method for reducing surface defects in the surface layer of a semiconductor sample which includes a volatile species, comprising the steps of:
   covering the surface layer of the semiconductor sample which includes a volatile species with a dummy layer,
   implanting atoms of said volatile species into said sample through said dummy layer at an energy necessary to implant some of said atoms to fill species vacancies in said surface layer, and
   rapid thermal annealing said sample for a duration and time necessary to move some of said implanted species atoms which occupy interstitial sites in the surface layer to substitutional sites in the surface layer, so that said surface layer has less species vacancies after said covering, implanting and annealing than before, and wherein said sample comprises gallium nitride (GaN).

24. A method for reducing surface defects in the surface layer of a semiconductor sample which includes a volatile species, comprising the steps of:

covering the surface layer of the semiconductor sample which includes a volatile species with a dummy layer, implanting atoms of said volatile species into said sample through said dummy layer at an energy necessary to implant some of said atoms to fill species vacancies in said surface layer, and rapid thermal annealing said sample for a duration and time necessary to move some of said implanted species atoms which occupy interstitial sites in the surface layer to substitutional sites in the surface layer, and so that said surface layer has less species vacancies after said covering, implanting and annealing than before, and further comprising the step of tilting said sample prior to the implanting of species atoms so that a side wall on said surface layer receives implanted species atoms to fill species vacancies.

25. The method of claim 24, wherein said sample is tilted at an angle of about +45 degrees with respect to the normal of said surface layer to implant species atoms on a first side wall, and further comprising the step of tilting said sample at an angle of about −45 degrees with respect to the normal of said surface layer to implant species atoms on an opposite side wall.

* * * * *

UNITED STATES PATENT AND TRADEMARK OFFICE
CERTIFICATE OF CORRECTION

PATENT NO.    : 5,766,695
DATED         : June 16, 1998
INVENTOR(S)   : Chanh N. Nguyen et al.

It is certified that error appears in the above-identified patent and that said Letters Patent is hereby corrected as shown below:

<u>Title page,</u>
Item [22], Filed: "Nov. 26, 1996" should read -- Nov. 27, 1996 --

Signed and Sealed this

Twenty-seventh Day of August, 2002

Attest:

Attesting Officer

JAMES E. ROGAN
Director of the United States Patent and Trademark Office